United States Patent
Bosnyak et al.

(10) Patent No.: US 6,362,678 B1
(45) Date of Patent: Mar. 26, 2002

(54) CIRCUIT FOR REDUCING RISE/FALL TIMES FOR HIGH SPEED TRANSISTOR LOGIC

(75) Inventors: Robert J. Bosnyak, San Jose; José M. Cruz, Palo Alto, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/468,710

(22) Filed: Dec. 21, 1999

(51) Int. Cl.[7] ............................................. H03K 17/04
(52) U.S. Cl. ....................... 327/374; 327/170; 327/112; 327/376; 327/323; 326/83; 326/89; 326/30
(58) Field of Search ................................ 327/108, 112, 327/170, 312–313, 315, 316, 323, 374, 376–377, 380, 381; 326/26, 27, 31, 30, 82–88, 90–92; 323/312, 315

(56) References Cited

U.S. PATENT DOCUMENTS

| | | | | |
|---|---|---|---|---|
| 4,006,370 A | * | 2/1977 | Erler | 327/377 |
| 4,159,450 A | * | 6/1979 | Hoover | 330/264 |
| 4,593,206 A | * | 6/1986 | Neidorff et al. | 326/90 |
| 4,620,115 A | * | 10/1986 | Lee et al. | 326/90 |
| 4,682,050 A | * | 7/1987 | Beranger et al. | 326/90 |
| 4,855,622 A | * | 8/1989 | JohnSon | 326/26 |
| 4,950,976 A | * | 8/1990 | Wagoner | 323/312 |
| 5,283,480 A | * | 2/1994 | Usami et al. | 327/535 |
| 5,298,802 A | * | 3/1994 | Usami et al. | 327/535 |
| 6,100,742 A | * | 8/2000 | Erckert | 327/374 |

\* cited by examiner

*Primary Examiner*—Terry D. Cunningham
*Assistant Examiner*—Long Nguyen
(74) *Attorney, Agent, or Firm*—Townsend and Townsend and Crew LLP

(57) ABSTRACT

An improved output driver for HSTL includes a bias control transistor to absorb current leaking through the base-collector capacitance of the drive transistor and maintain the base voltage on the drive transistor. The bias control transistor is biased by a series network coupled between a base of the bias control transistor and ground, which keeps the bias control transistor at a bias near its turn-on bias, with a feedback capacitor coupled between the output and the base of the bias control transistor to turn on the bias control transistor when the output rises.

10 Claims, 4 Drawing Sheets

US 6,362,678 B1

CIRCUIT FOR REDUCING RISE/FALL TIMES FOR HIGH SPEED TRANSISTOR LOGIC

BACKGROUND OF THE INVENTION

The present invention relates generally to transistor logic circuits and more specifically to transistor logic circuits used for high speed transistor logic.

Several different logic design technologies are used in implementing circuits, where the particular logic design technology used depends on factors such as speed, power and voltage constraints. One such logic design technology is HSTL (High Speed Transistor Logic). With HSTL, a logical high output ("1" or VOH) is represented by a voltage of about 1.5 volts, while a logical low output ("0" or VOL) is represented by a voltage of about 0.8 volts. In addition, the characteristic impedance, $Z_0$, of an HSTL output is usually 50 ohms terminated to 1.5 volts. The rise and fall times for transitions between logical levels are specified to be around 200 to 300 picoseconds (ps).

FIG. 1 shows a typical output driver that might be used to provide an HSTL signal output. The output driver is shown comprising transistors Q1, Q2, Q3, Q4, a current source $I_1$, a termination resistor RT and a bias resistor R3. In operation, Q1 and Q2 form a current mirror, with the current source $I_1$ providing current to Q1 and a pull-up circuit (Q4, RT) providing current to Q2. Q3 and R3 are provided to correct for beta error in the current mirror.

One problem with the output driver shown in FIG. 1 is that, if R3 is large, it will prevent a quick turn off of Q2 at the beginning of a rising edge of the output. This occurs because, as drive transistor Q2 is turning off, current from the output leaks to the base of drive transistor Q2 through the base-collector parasitic capacitance of Q2. If R3 is small, that parasitic current flows through R3, but when R3 is large, that parasitic current ends up being additional base current through Q2, thus preventing a quick turn off of Q2.

FIG. 2 is a schematic illustrating one solution that has been used to address the above problem. As shown in the schematic, a control transistor Q5 is coupled between the base of a drive transistor Q2 and ground. The base voltage of control transistor Q5 is set by a resistor R6, inserted between the base of Q2 and the base of Q5, and by a Shottky diode reverse biased between the base of Q5 and ground. Another Shottky diode D3 is provided between the output and the base of Q5, to act as a capacitor to turn on Q5 when the output voltage rises. Alternatively, D3 could be replaced with a capacitor.

In the circuit shown in FIG. 2, D2 creates a recovery path or clamping action at the base of Q5. By the action of D3 (or a capacitor used in its place), the base of Q5 rises as voltage at the output rises. This capacitive coupling causes Q5 to turn on when the output rises, thus helping Q2 to turn off. That same capacitive coupling causes the base of Q5 to go negative when the output voltage falls. Without D2, the base of Q5 would go negative enough to reach −VOH+VOL−VBE, or roughly −3 volts. If the base of Q5 did get that negative, a recovery period would be required to recharge the base of Q5, normally through current passed through R6. However, with D2 present, the lower voltage at the base of Q5 is clamped at −VSBD (about −0.5 volts), so the base of Q5 recovers faster.

While the circuit shown in FIG. 2 may shorten the rise time of the output, it is subject to a number of process variations that might be difficult to control, such as the resistance of R6, the capacitance of D3 and the turn-on voltage of Q5.

SUMMARY OF THE INVENTION

The present invention provides an improved output driver for HSTL. In one embodiment of an output driver according to the present invention, a bias control transistor is provided to absorb current leaking through the base-collector capacitance of the drive transistor and maintain the base voltage on the drive transistor. The bias control transistor is biased by a series network that urges the bias control transistor to a bias near the bias control transistor's turn-on bias, with a feedback capacitor coupled between the output and the base of the bias control transistor to turn on the bias control transistor when the output rises.

One advantage of the present invention is that it provides a circuit that creates a transient pull-down current for a high speed transistor logic family with controlled characteristic impedance and low level output voltages.

A further understanding of the nature and advantages of the inventions herein may be realized by reference to the remaining portions of the specification and the attached drawings.

DESCRIPTION OF THE SPECIFIC EMBODIMENTS

Figure 1:
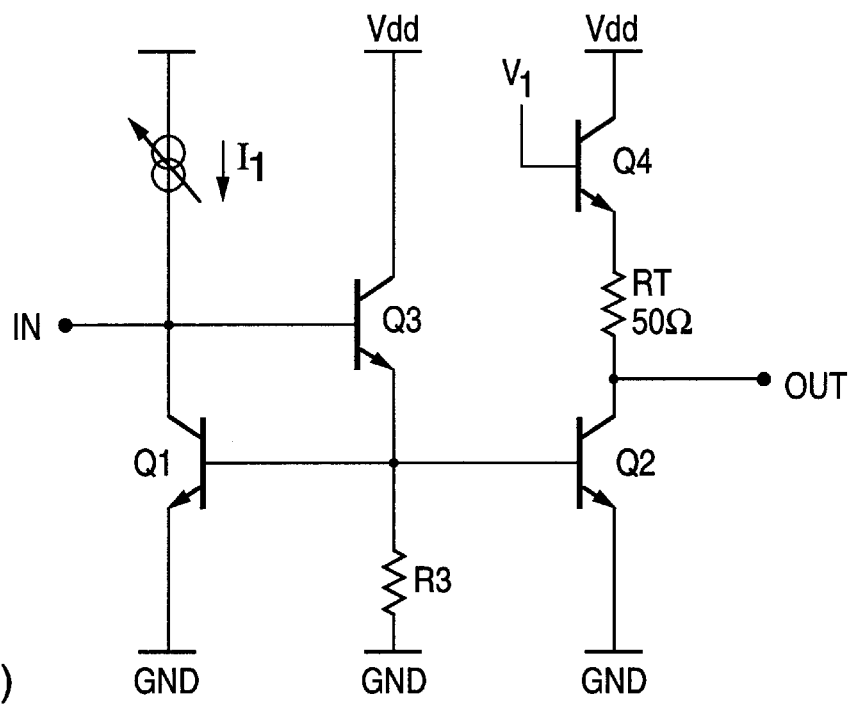
FIG. 1 is a schematic of a prior art output driver.
Figure 2:
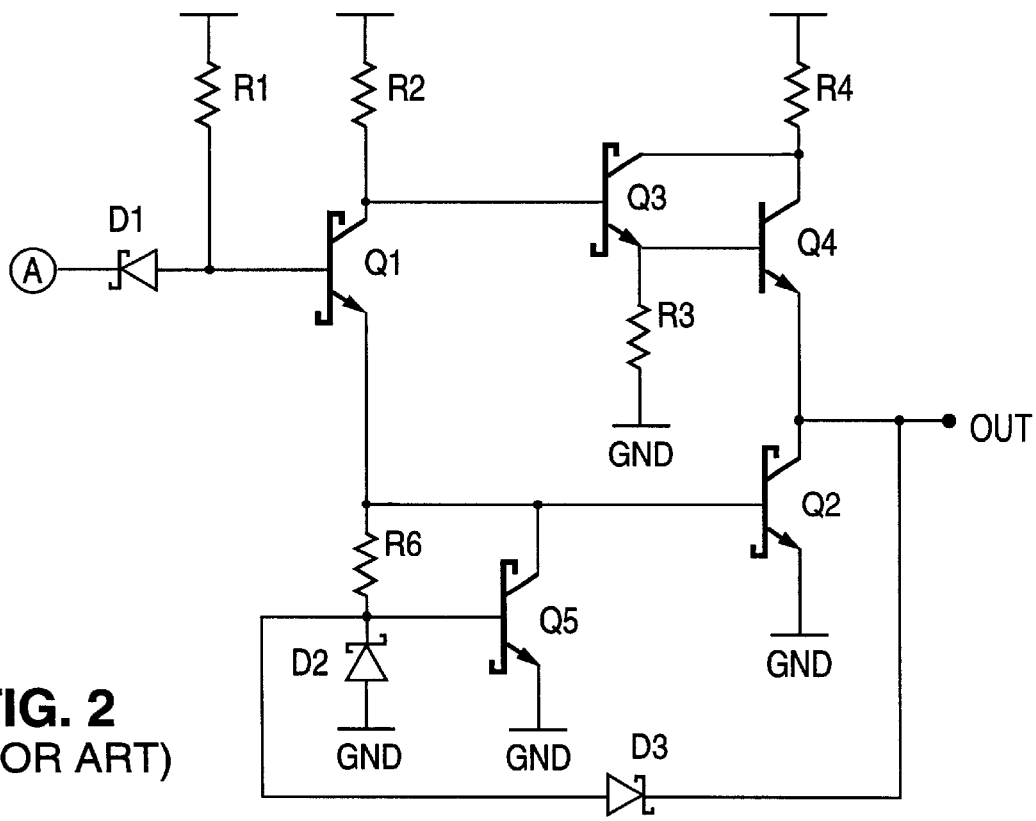
FIG. 2 is a schematic of a prior art output driver that attempts to improve an output rise time over the output driver of FIG. 1.
Figure 3:
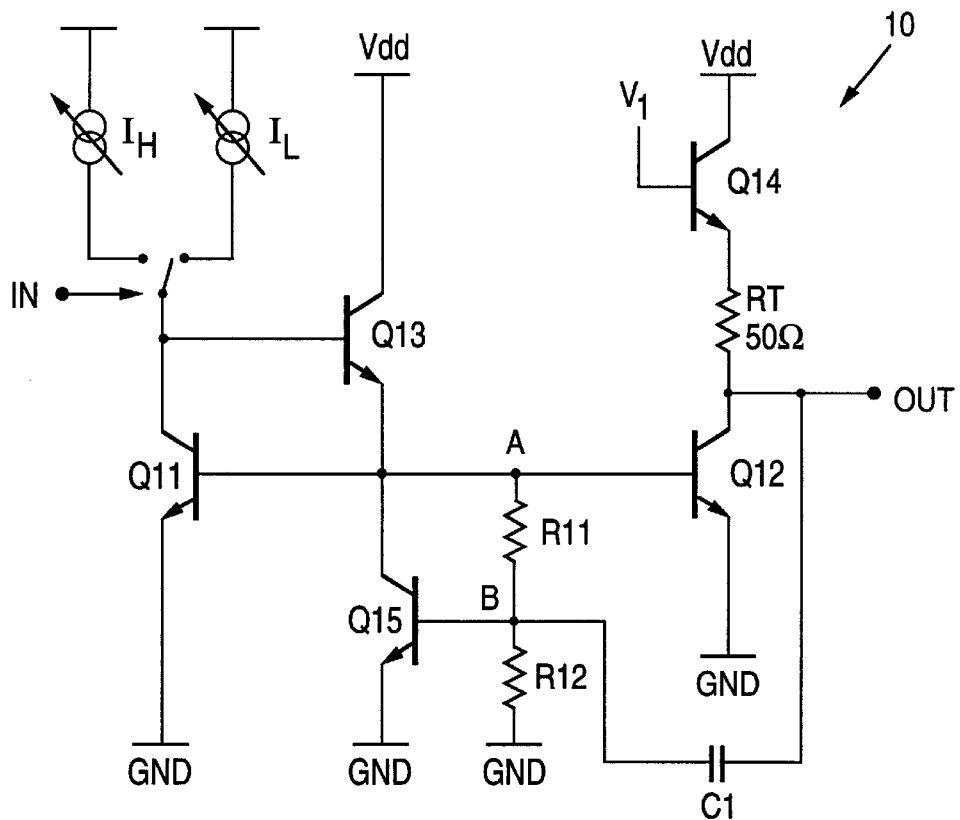
FIG. 3 is a schematic diagram of an improved output driver according to the present invention.

FIG. 3 is a schematic diagram of an output driver 10 according to the present invention. Output driver 10 comprises a current mirror, a beta error correction circuit, a bias control circuit and a pull-up circuit. The current mirror is formed with the input current source providing a current to a first transistor Q11 that is mirrored to a second transistor Q12. With the bases of Q11 and Q12 connected together and both emitters connected to ground, the collector current of Q12 mirrors the collector current of Q11 (essentially the input current times the ratio of transistor areas $A_{Q12}/A_{Q11}$). The collector of Q12 is coupled to the output node of output driver 10 and that collector is pulled up by RT, a 50 ohm termination resistor, and a pull-up transistor Q14. Q12 provides a bias current to the output node to keep the output impedance at around $Z_0$.

The input to output driver 10 operates by switching the input current into the collector of Q11 between a high current, $I_H$, to a low current, $I_L$, as a voltage $V_1$, applied to the base of pull-up transistor Q14 switches from VOL to VOH. In other words, the input current goes to $I_H$ as $V_1$ goes to VOL and goes to $I_L$ as $V_1$ goes to VOH. $V_1$ is a conditioned voltage in that however $V_1$ is generated, variations in temperature, process and supply voltage are compensated for. The Thevenin equivalent of the output is $R_{TH}$ (50 ohms or other designed output impedance) at both VOH and at VOL.

The bias currents are switched as the output node rises with $V_1$ high (approximately VOH+$VBE_{Q14}$+50 ohms*$I_{C[Q12]}$) and falls with $V_1$ low (approximately VOL+ $VBE_{Q14}$+50 ohms*$I_{C[Q11]}$). The rise and fall of the output are slowed by the parasitic base-collector capacitance of Q12, because that capacitance slows the rise and fall of node A. However, by adding a transistor Q15, the resistive bias network R11/R12 and a capacitor C1 as shown, the voltage at node A is then "out of phase" with the output node. Being out of phase, the output rise and fall are faster, since pulling node A low causes Q12 to shut off faster and pulling node A high causes Q12 to turn on faster. Node A recovers quickly, and well within the cycle time dictated by the input, because node A stays within a narrow voltage range and Q13 acts as an emitter follower low resistance clamp.

In output driver 10, the beta error correction circuit comprises a transistor Q13 that is switched by the input and base currents for Q11 and Q12. This correction is useful so that process variations that might otherwise cause variances between Q11's collector current and Q12's collector current are corrected for.

The bias control circuit comprises transistor Q15, resistive bias network R11/R12, and capacitor C1. Q15 is coupled between the bases of Q11/Q12 (node A) and ground. Resistive bias network R11/R12 is coupled in series between node A and ground to set a quiescent bias level for Q15, while capacitor C1 is coupled between the output node and the base of Q15.

When the input current switches, the bias level of Q12 changes through mirror action. As a result, the current through Q12 drops and as a result of $V_1$ rising, the output will begin to rise. When the input switches from high to low current, Q13 turns off and, as a result, the voltage on node A drops. That in turn causes Q11 and Q12 to turn off, thus mirroring the collector current from Q11 onto Q12. As Q12 turns off, the output will begin to rise. When the output is rising, Q12 is kept on by the Miller capacitance effect, resulting in slower rise times as the pull-up circuit (Q14, RT) must supply a parasitic current that is beta times the coupled current. However, with output driver 10, the parasitic current is absorbed by Q15. If Q15 is switched on only when the output is rising, it does not add much to the overall power consumption of output driver 10.

Q15 is switched by selecting R11 and R12 such that Q15 is on the verge of turning on when the output node is at VOL. For example, if the resistance of R11 is 7 times the resistance of R12, then VBE for Q15 (node B) is ⅞ths of the voltage at node A, which is VBE of Q12. That way, Q15 does not dissipate much power, until capacitor C1 provides enough added current to turn Q15 on. When the output rises, C1 causes node B (the base of Q15) to rise, turning on Q15 and allowing Q15 to absorb any parasite charge, thus keeping Q12 turned off. As a result, Q12 operates with greatly reduced current during the rise time at the output and thus increases the output rise slew rate. Capacitor C1 is formed as a poly-poly plate capacitor, but it could be formed by other well known methods.

As described herein, the novel output driver achieves an increased output rise slew rate without excessive amounts of power being dissipated, since the added bias control transistor is only operated at high current levels during the rise transition. Node A recovers easily because node A is biased by an emitter follower (Q13) that responds quickly to force node A back to its steady state voltage.

Figure 4:
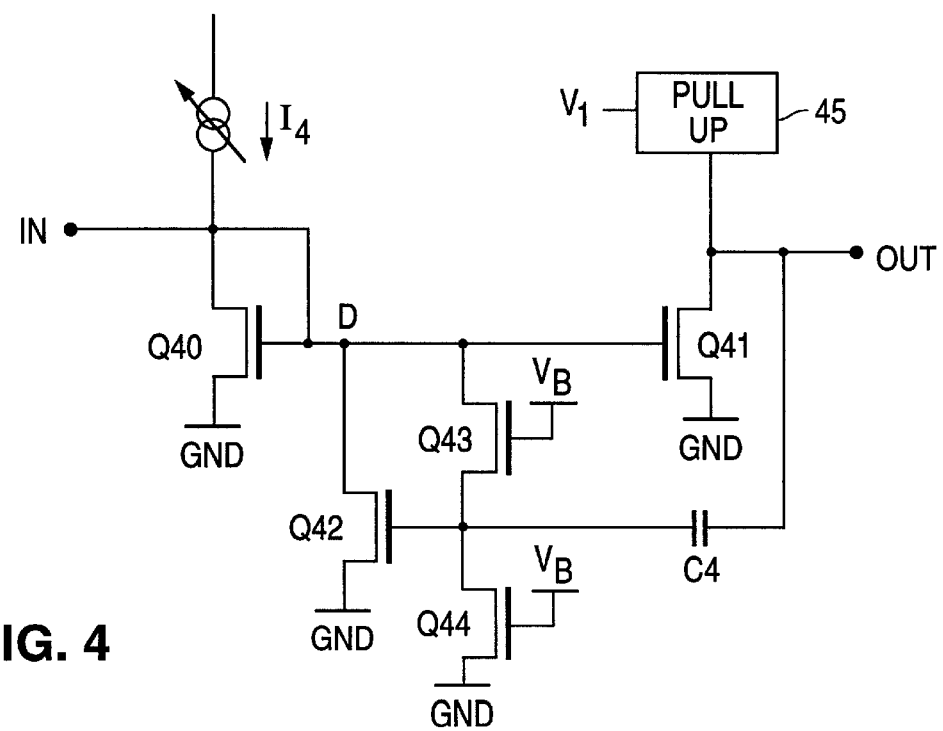
FIG. 4 is a schematic diagram of a variation of the improved output driver using NMOS transistors.

FIG. 4 is a schematic of an output driver as might be used with NMOS transistors. As shown, transistors Q40 and Q41 form a current mirror. Q40 is supplied with current, in part, by a current source 14 and Q41 is supplied with current from a pull-up circuit 45. Pull-up circuit 45 might include a termination resistor if one is needed to set the output impedance.

A capacitor C4 and a transistor Q42 absorb the parasitic capacitance current, so that the output rise is not slowed. This is because C4 is coupled between the output and the gate of Q42 and Q42 is coupled between a node D and ground, where node D is at the bases of the current mirror transistors (Q40, Q41). When the output begins to rise, C4 turns on Q42, thus lowering the voltage at node D. Transistors Q43 and Q44 are provided to bias the gate of Q42 to just below its $V_{TH}$ in the quiescent state, and Q43 and Q44 are sized to create such an effect. Q43 and Q44 are preferably biased by a gate voltage, $V_B$, such that Q43 and Q44 are in the triode or linear region of their operation. This is because their $V_{DS}$ is less than or equal to their $V_{GS}$. If Q43 and Q44 are in the linear region, their V/I characteristics make them effectively resistors. By sizing the width and lengths of Q43 and Q44 appropriately, a "resistor" divider is created. Alternatively, transistors Q43 and Q44 can be replaced with a resistive network.

Figure 5:
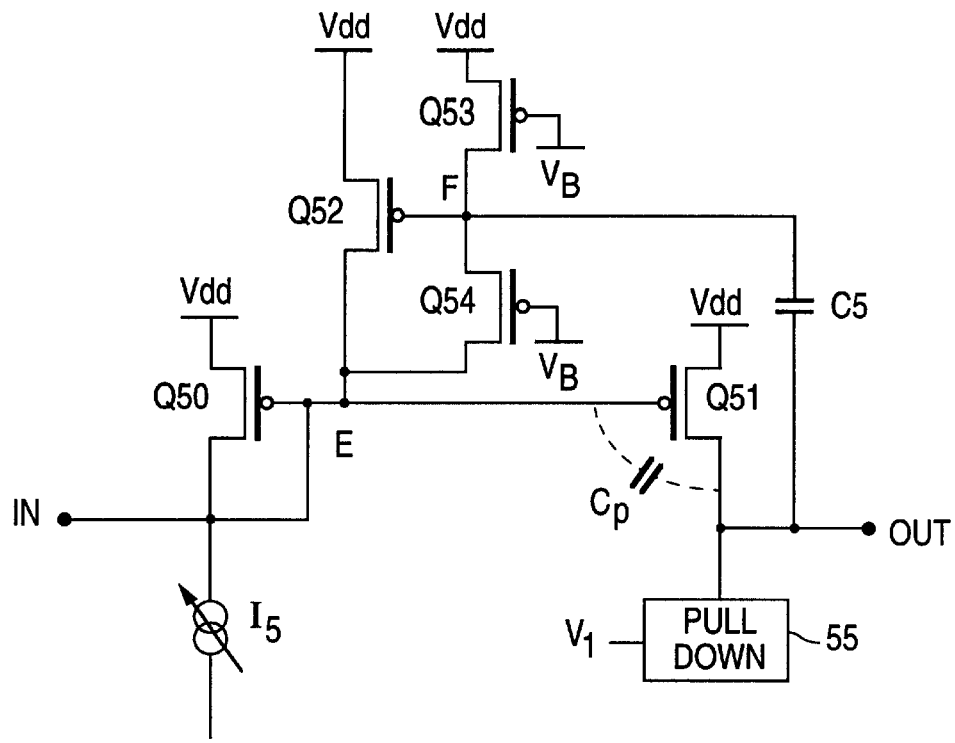
FIG. 5 is a schematic diagram of a variation of the improved output driver using PMOS transistors.

FIG. 5 is a schematic of an output driver similar to that of FIG. 4, but for use with PMOS transistors. As shown, transistors Q50 and Q51 form a current mirror, with a current source 15 being a drain for current from Q50 and pull-down circuit 55 being a current drain for Q51. In this case, a parasitic Miller capacitance ($C_P$) is present and shown between the gate of QS (node E) and the source terminal of Q51, which is coupled to the output and pull-down circuit 55. To reduce the effect of $C_P$ on fall times, a circuit comprising PMOS transistors Q52, Q53, Q54 and a capacitor C5 is provided. Q52 is coupled between $V_{dd}$ and node E, with its gate connected to a node F. Q53 and Q54 are serially connected between Vdd and node E to provide a resistive divider network for setting a gate bias for Q52. Node F is the node between Q53 and Q54.

The gate bias can be set to the desired level by suitable selection of the ratios of transistors Q53 and Q54. Alternatively, a pair of resistors could be used in place of Q53 and Q54. Capacitor C5 is coupled between the output and node F, to turn on Q52 during a falling output. When the output begins to fall and C5 turns on Q52, that raises the voltage at node E and keeps Q51 from turning on (or from staying on) due to the effects of $C_P$. Pull-up circuit 55 might include a termination resistor if one is needed to set the output impedance.

Figure 6:
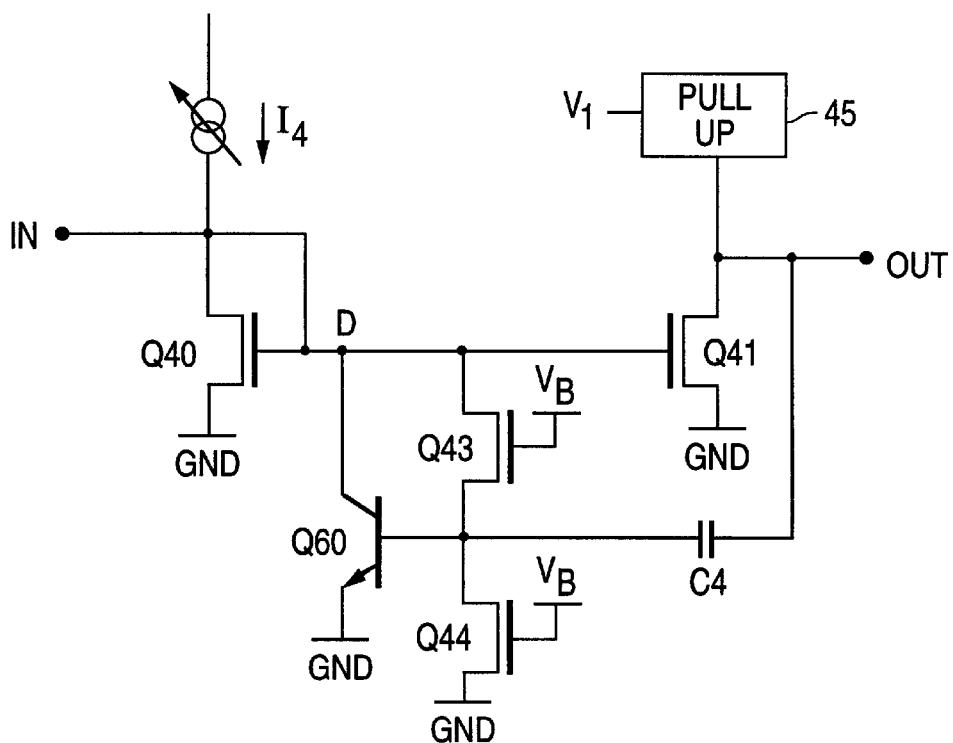
FIG. 6 is a schematic diagram of another variation of the improved output driver using NMOS transistors and a bipolar transistor (BiCMOS).
Figure 7:
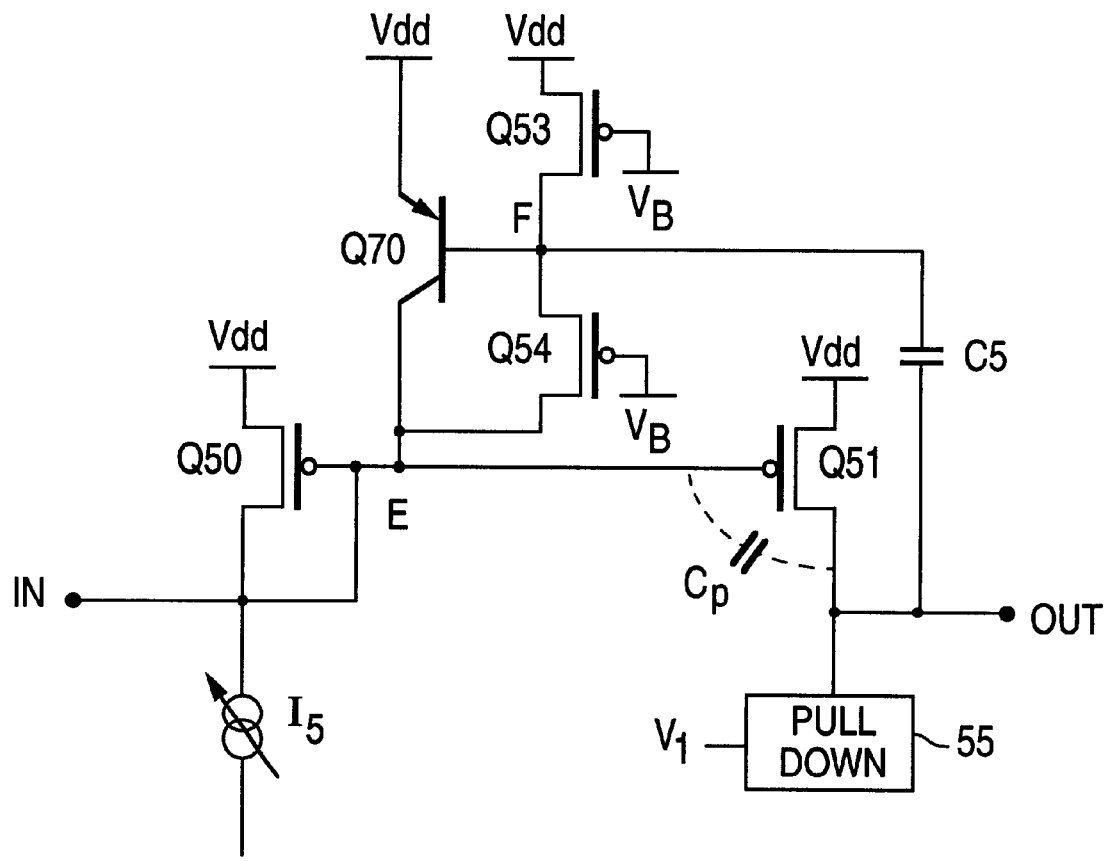
FIG. 7 is a schematic diagram of another variation of the improved output driver using PMOS transistors and a bipolar transistor (BiCMOS).

FIGS. 6–7 depict BiCMOS variations of the circuits shown in FIG. 4–5. In the circuit of FIG. 6, NMOS transistor Q42 is replaced by a bipolar transistor Q60. In the circuit of FIG. 7, PMOS transistor Q52 is replaced by a bipolar transistor Q70.

In summary, a novel output driver and several variations have now been described. The foregoing description of preferred embodiments of the invention has been presented for the purposes of description. It is not intended to be exhaustive or to limit the invention to the precise form described, and modifications and variations are possible in light of the teachings above.

What is claimed is:

1. An output driver for high speed transistor logic, wherein an output is driven by switching a drive transistor which is coupled to the output and draws current from a pull-up circuit coupled between the output and a supply voltage node, the output driver comprising:

a bias control transistor, coupled to a base of the drive transistor;

a bias control transistor bias network coupled between a base of the bias control transistor, the base of the drive transistor and a fixed voltage node, wherein the bias control transistor bias network is configured to maintain the bias control transistor at a bias approximately a bias control transistor turn-on bias; and a feedback capacitor, coupled between the output and the base of the bias control transistor.

2. The output driver of claim 1, wherein the pull-up circuit includes a termination resistor.

3. The output driver of claim 1, wherein the fixed voltage node is ground.

4. The output driver of claim 1, wherein the bias control network comprises:

a first resistor coupled between the base of the drive transistor and the base of the bias control transistor; and a second resistor coupled between the base of the bias control transistor and the fixed voltage node.

5. The output driver of claim 1, wherein the feedback capacitor is sized to turn on the bias control transistor as an output voltage rises in response to a changing input before the output voltage rises to its logical high value.

6. The output driver of claim 1 wherein the bias control transistor bias network maintaining the bias control transistor at a bias approximately at a bias control transistor turn-on bias serves to increase a slew rate at the output.

7. An output driver for high speed transistor logic using NMOS devices, wherein an output is driven by switching a drive transistor which is coupled to the output and draws current from a pull-up circuit coupled between the output and a supply voltage node, the output driver comprising:

a bias control transistor, coupled to a gate of the drive transistor;

a bias control transistor bias network coupled between a gate of the bias control transistor, the gate of the drive transistor and a fixed voltage node, wherein the bias control transistor bias network is configured to maintain the bias control transistor at a bias approximately at a bias control transistor turn-on bias; and a feedback capacitor, coupled between the output and the gate of the bias control transistor.

8. The output driver of claim 7, wherein the bias control transistor bias network maintaining the bias control transistor at a bias approximately at a bias control transistor turn-on bias serves to increase a slew rate at the output.

9. An output driver for high speed transistor logic using PMOS devices, wherein an output is driven by switching a drive transistor which is coupled to the output and sinks current into a pull-down circuit coupled between the output and ground, the output driver comprising:

a bias control transistor, coupled to a gate of the drive transistor;

a bias control transistor bias network coupled between a gate of the bias control transistor, the gate of the drive transistor and a fixed voltage node, wherein the bias control transistor bias network is configured to maintain the bias control transistor at a bias approximately at a bias control transistor turn-on bias; and a feedback capacitor, coupled between the output and the gate of the bias control transistor.

10. The output driver of claim 9, wherein the bias control transistor bias network maintaining the bias control transistor at a bias approximately at a bias control transistor turn-on bias serves to increase a slew rate at the output.

* * * * *